(12) United States Patent
Patterson et al.

(10) Patent No.: US 9,291,665 B2
(45) Date of Patent: Mar. 22, 2016

(54) EVALUATING TRANSISTORS WITH E-BEAM INSPECTION

(75) Inventors: Oliver D. Patterson, Poughkeepsie, NY (US); Zhigang Song, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 945 days.

(21) Appl. No.: 13/470,645

(22) Filed: May 14, 2012

(65) Prior Publication Data

US 2013/0300451 A1    Nov. 14, 2013

(51) Int. Cl.
*G01R 31/02*    (2006.01)
*G01R 31/265*   (2006.01)
*G01R 31/317*   (2006.01)
*G01R 31/27*    (2006.01)

(52) U.S. Cl.
CPC .......... *G01R 31/2653* (2013.01); *G01R 31/275* (2013.01); *G01R 31/31721* (2013.01)

(58) Field of Classification Search
CPC . G01R 31/3004; G01V 1/181; G01N 27/4148
USPC ........... 324/500, 762.05, 510–513, 537, 538; 318/268, 434
See application file for complete search history.

(56) References Cited

U.S. PATENT DOCUMENTS

| | | | |
|---|---|---|---|
| 5,155,672 A | 10/1992 | Brown | |
| 5,663,967 A | 9/1997 | Lindberg et al. | |
| 6,005,829 A | 12/1999 | Conn | |
| 6,278,956 B1 | 8/2001 | Leroux et al. | |
| 6,509,739 B1 | 1/2003 | Voogel et al. | |
| 7,420,229 B2 | 9/2008 | Schultz et al. | |
| 8,034,640 B2 | 10/2011 | Shin et al. | |
| 2006/0054783 A1* | 3/2006 | Voronov | H04N 5/235 250/208.1 |
| 2010/0304509 A1 | 12/2010 | Aghababazadeh et al. | |
| 2011/0013826 A1 | 1/2011 | Xiao | |
| 2011/0192975 A1 | 8/2011 | Chen | |
| 2011/0215241 A1 | 9/2011 | Wang et al. | |
| 2012/0294060 A1* | 11/2012 | Ohshima | G11C 11/005 365/72 |
| 2014/0340487 A1* | 11/2014 | Gilliland | G01S 7/4863 348/48 |

FOREIGN PATENT DOCUMENTS

CA    2044664 A1    2/1992
WO    2011108045 A1    9/2011

OTHER PUBLICATIONS

Gl Chiu, "Contactless Testable Latches," IBM, IP.com; Prior Art Database; Technical Disclsoure; IPCOM000061074D; Jun. 1986; pp. 1-3.

Enrico Zanoni, et al., "Observation of Latch-Up Time Evolution in CMOS IC's by Means of SEM Stroboscopic Voltage Contrast Techniques," IEEE Journal of Solid-State Circuits, SC-22, No. 1, Feb. 1987; pp. 65-70.

* cited by examiner

*Primary Examiner* — Melissa Koval
*Assistant Examiner* — Trung Nguyen
(74) *Attorney, Agent, or Firm* — Cantor Colburn LLP

(57) ABSTRACT

A test structure of a semiconductor wafer includes a series of electrical units connected electrically in series output-to-input in an open loop configuration. The series of electrical units is configured to have alternating output voltages, such that each electrical unit is configured to output a voltage opposite an output voltage of a preceding electrical unit. Each electrical unit is configured to have an output voltage that alternates when an input voltage applied to a first electrical unit in the series of electrical units alternates.

21 Claims, 10 Drawing Sheets

EVALUATING TRANSISTORS WITH E-BEAM INSPECTION

BACKGROUND

The present invention relates generally to a system and method of evaluating transistors, and in particular to a system and method of evaluating transistor functionality with an electron beam (e-beam).

P-type and N-type field effect transistors (FETs) are the fundamental building-blocks of CMOS circuitry. In-line evaluation of these transistors is typically performed using electrical tests, such as by applying electrical probes to small circuits such as individual transistors or functional circuits, like static random access memory (SRAM) arrays having between four to six metal layers or levels.

SUMMARY

An exemplary embodiment of the invention includes a test structure of a semiconductor wafer including a series of electrical units connected electrically in series output-to-input in an open loop configuration. The series of electrical units is configured to have alternating output voltages, such that each electrical unit is configured to output a voltage opposite an output voltage of a preceding electrical unit. Each electrical unit is configured to have an output voltage that alternates when an input voltage applied to a first electrical unit in the series of electrical units alternates.

Another exemplary embodiment of the invention includes a method including applying a voltage to a test structure including a plurality of electrical units connected in series output-to-input. Each of the plurality of electrical units is configured to output a voltage at a level opposite a voltage level of a preceding electrical unit of the plurality of electrical units connected in series. The method includes determining whether a fault exists in the test structure by generating an e-beam image of the test structure and analyzing output voltages of the plurality of electrical units in the e-beam image to determine whether output voltages of two consecutive electrical units are the same.

A further exemplary embodiment of the invention includes a system including a test structure of a semiconductor chip, an e-beam assembly, and an analysis unit. The test structure includes a series of electrical units connected output-to-input. The series of electrical units is configured to have alternating output voltages, such that each electrical unit is configured to output a voltage opposite an output voltage of a preceding electrical unit and such that each electrical unit is configured to have an output voltage that alternates when an input voltage applied to a first electrical unit in the series of electrical units alternates. The e-beam assembly is configured to direct an e-beam at a test structure to detect voltage levels at outputs of the electrical units. The analysis unit is configured to detect whether a faulty electrical unit exists in the test structure by analyzing an image generated by the e-beam assembly.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1:
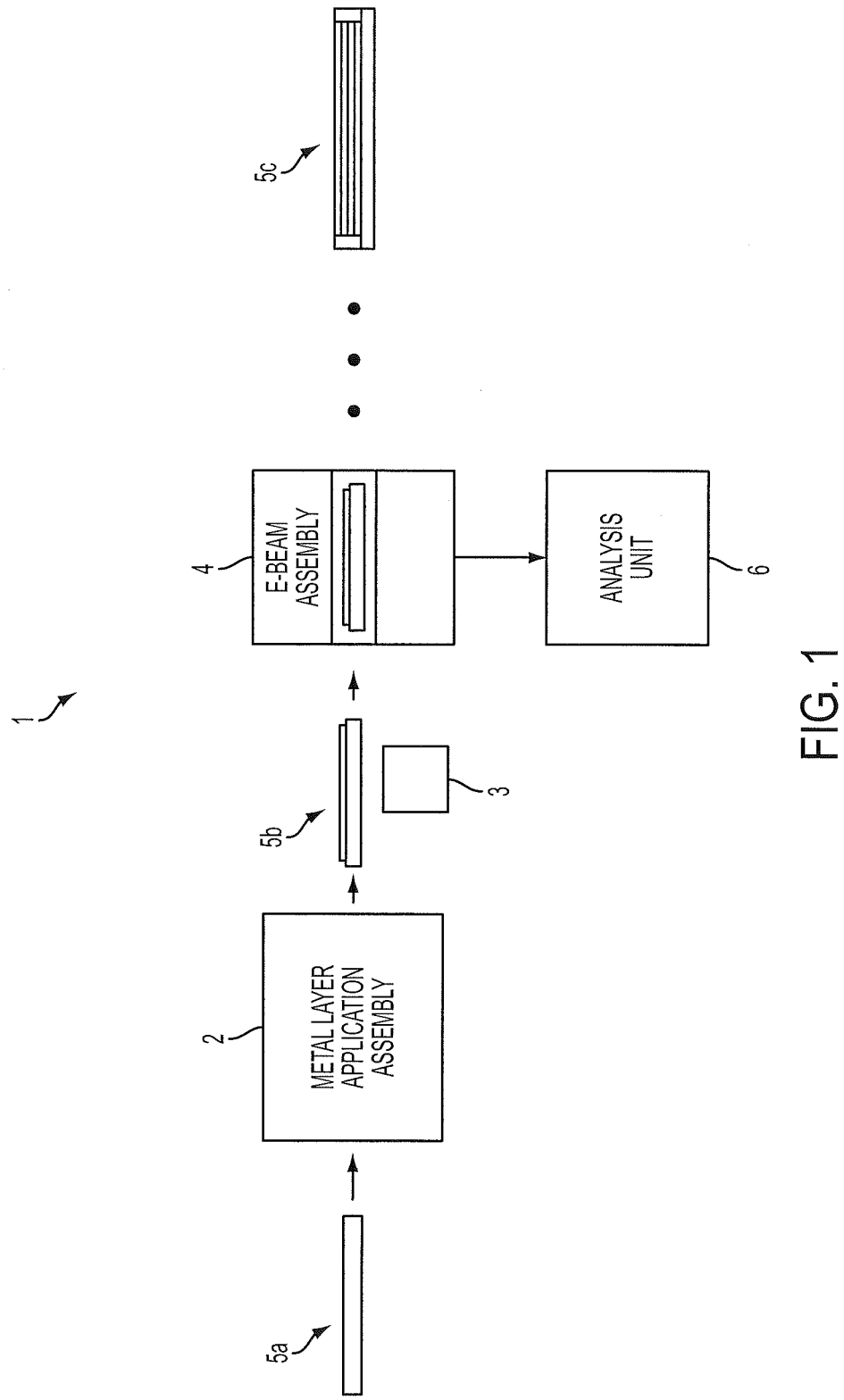
FIG. 1 illustrates a fault detection system according to one embodiment of the invention.

With reference to FIG. 1, a fault detection system 1 includes a metal layer application assembly 2, a conveyor apparatus 3, an e-beam assembly 4, and an analysis unit 6. In operation, a wafer 5a having no metal layer formed thereon is provided to the metal layer application assembly 2. The wafer 5a may include, for example, semiconductor structures, such as p- and n-doped regions and buffer regions. The metal layer application assembly 2 applies a metal layer to form wiring, transistor connections, and other components on the wafer 5a. The metal layer application assembly 2 may apply any known method to apply metal layers, including vapor deposition, etching, photolithography, laser etching, or any other method. In FIG. 1, the wafer 5b represents the wafer having one metal layer formed on a surface of a substrate. The conveyor apparatus 3 removes the wafer 5b having the one metal layer formed thereon from the metal layer application assembly 2 and provides the wafer 5b to the e-beam assembly 4.

The e-beam assembly 4 includes, for example, an e-beam generating device and a surface or support to position the wafer 5b in an analysis position under the e-beam generating device. The e-beam assembly 4 is configured to have a voltage contrast mode, or a mode in which images generated by application of the e-beam to the wafer 5b illustrate different voltages in different regions of the area exposed to the e-beam. In one embodiment, areas having a higher voltage appear darker and areas having a lower voltage appear lighter. Although an e-beam assembly 4 is provided in FIG. 1, embodiments of the invention include any voltage imaging device capable of providing an image of traces formed on a wafer down to a nanometer scale and capable of visually differentiating in the image between voltages present at different portions of the traces at the same time.

An analysis unit 6 analyzes the data generated by the e-beam assembly 4, which may include images or digital data corresponding to images generated by the e-beam assembly 4, and the analysis unit 6 determines whether faulty transistors, inverters, or latches are present in test structures formed in the first metal layer of the wafer 5b. If a faulty inverter or latch is identified, physical failure analysis is performed to understand the root cause.

A typical static random access memory (SRAM) requires that four to six metal layers be formed to test its functionality. According to embodiments of the invention, the functionality of the building blocks of SRAM or other semiconductor circuits may be tested as early as the first metal layer and thus predict the functionality of the SRAM or other semiconductor circuits. In particular, the field effect transistors (FETs) that make up the SRAM or other semiconductor circuits, such as PFETs and NFETs, may be tested as early as the first metal layer.

In the present specification and claims, the term "first metal layer" refers to a first layer formed on a substrate, meaning no other metal layer is formed between the first metal layer and the substrate.

Although embodiments of the present disclosure describe forming test structures in the first metal layer, alternative embodiments of the present disclosure encompass test structures formed in any metal layer of a wafer.

In one embodiment, the wafer with test structures is one wafer selected from among a plurality of wafers, such as a series of wafers in a manufacturing line or batch. In such an embodiment, the one selected wafer with the test structures from among the plurality of wafers is tested by the e-beam assembly. By this means, a batch of a plurality of wafers may be tested by testing only one wafer 5b as a sample wafer of the batch.

In one embodiment, after being tested, the wafer 5b may continue to be processed if no fault is detected by the e-beam assembly 4, or if a number of detected faults is within a predetermined threshold. In another embodiment, the one wafer 5b having more detected faults than the predetermined threshold is taken out of the manufacturing line for further physical failure analysis.

In one embodiment, the ellipses of FIG. 1 represent additional metal layer application assemblies 2 for adding the additional metal layers to the wafers 5. In other words, in one embodiment a plurality of wafers 5 receive consecutive metal layers from one metal layer application assembly 2, and wafers 5 are tested by one e-beam assembly 4, while in other embodiments, a separate metal layer application assembly 2 applies each consecutive metal layer to the wafers 5.

In embodiments of the invention, the applying the e-beam to a test structure on a wafer 5b results in alternating high and low voltage levels when a voltage is applied at one end of the test structure. For example, in one embodiment, the test structure includes a string of inverters connected input-to-output. In another embodiment, the test structure includes a series of latches, such as SRAM-like latches, connected input-to-output. A number of inverters or latches formed may depend upon design considerations, such as fault tolerance requirements. For example, numbers of electrical elements in a test structure may range from two to one billion. In particular, in some embodiments the number of electrical elements in a test structure may range from one thousand to one hundred thousand.

Figure 2:
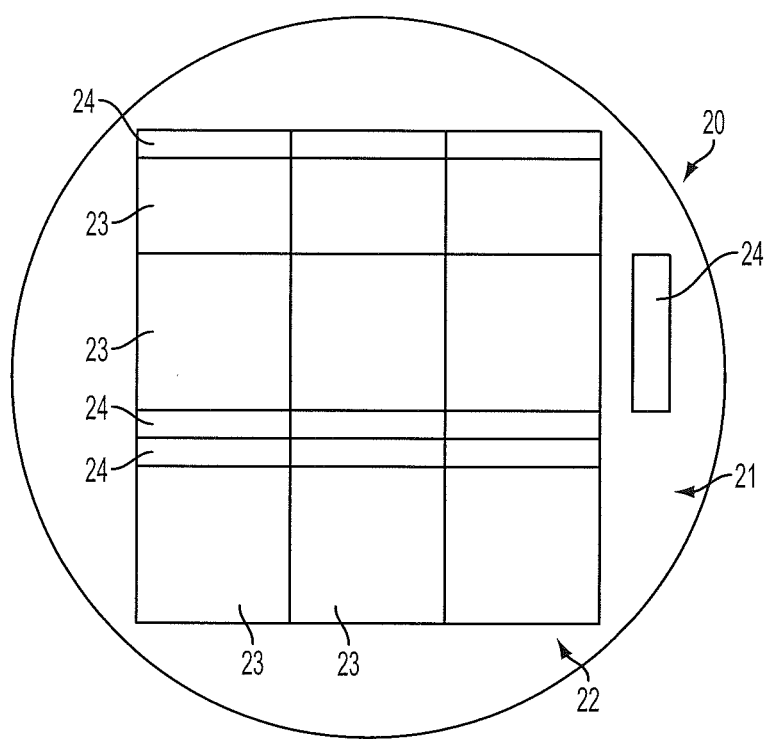
FIG. 2 illustrates a wafer according to an embodiment of the invention.

FIG. 2 illustrates a wafer 20 including at least one metal layer according to an embodiment of the invention. The wafer 20 may correspond to the wafer 5b having only one metal layer, as illustrated in FIG. 1, or may correspond to a wafer, such as wafer 5c having multiple metal layers. The wafer 20 includes a substrate 21 on which a metal layer is formed to form semiconductor modules 23 and test structures 24. The semiconductor modules 23 may include, for example, SRAM devices, memory chips, processing chips, logic chips, clock chips, or any other type of semiconductor device or structure.

In one embodiment of the present disclosure, the test structures 24 are formed at the ends of the semiconductor modules 23. Accordingly, each semiconductor module 23 may be formed to adjoin a corresponding separate test structure 24. In an alternative embodiment, one or more test structures 24 may be formed apart from the semiconductor modules 23.

In one embodiment in which only one metal layer is formed, the test structures 24 may be completely formed, while SRAM circuits in the semiconductor modules are unfinished, having only one metal layer. In alternative embodiments in which multiple metal layers are formed, the SRAM circuits may be finished and the semiconductor modules 23 may be fully formed or operational.

Although the test structures 24 of the wafer 20 may be inspected by an e-beam assembly 4 after forming any number of metal layers on the substrate 21, it is understood that by inspecting the test structures 24 earlier in the metal layer formation process, flaws in the substrate 21, such as in the PFET and NFET structures in the substrate, may be detected, isolated, and corrected sooner.

Figure 3:
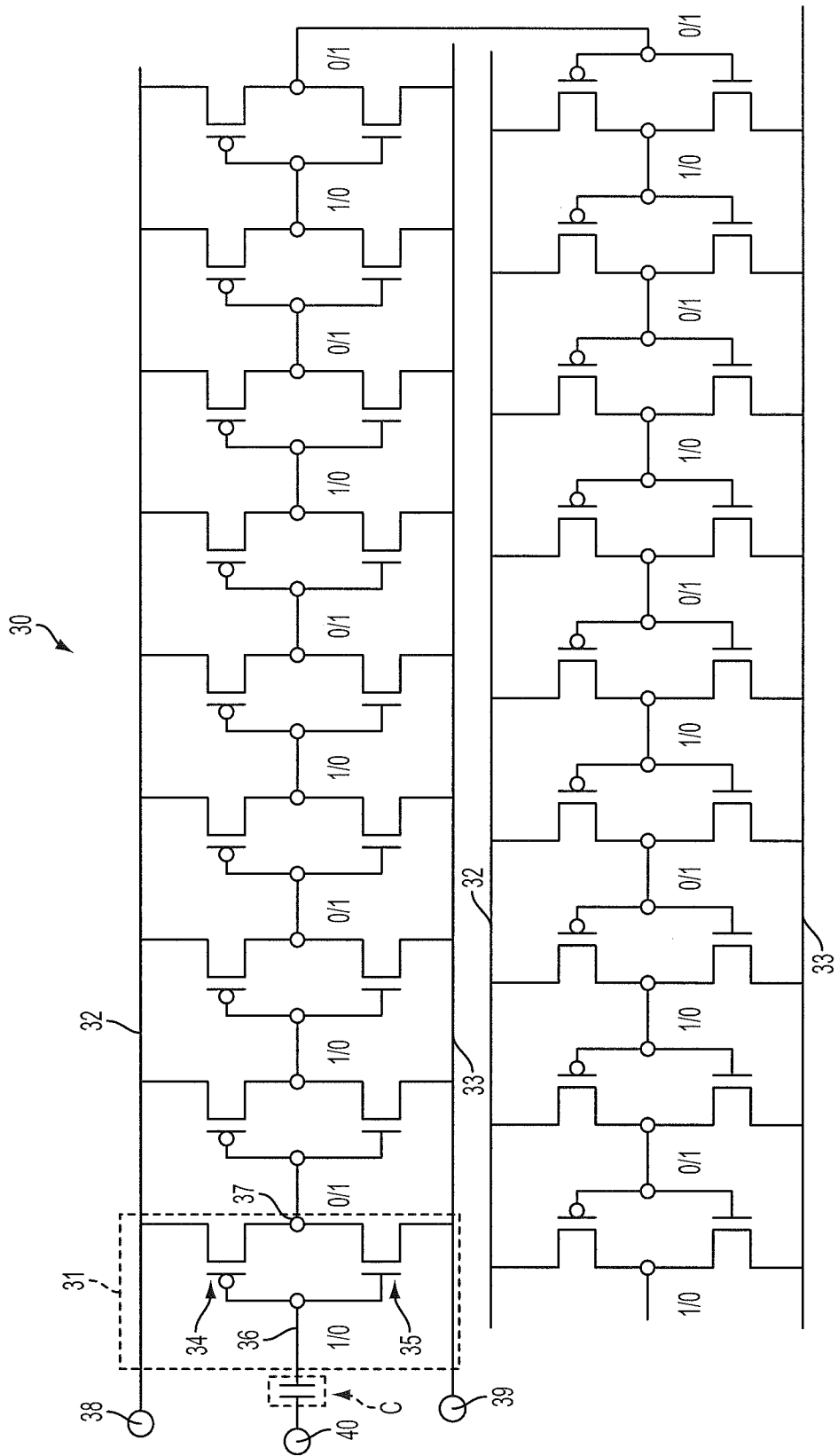
FIG. 3 is a circuit diagram of a test structure according to an embodiment of the invention.

FIG. 3 illustrates an example of a test structure 30 according to one embodiment of the invention. In FIG. 3, the test structure includes a plurality of inverters connected input-to-output. For example, inverter 31 consists of a PFET 34 connected to positive power (Vdd) and an NFET 35 connected to ground (Vss). The PFET 34 and the NFET 35 are connected to each other gate-to-gate and drain-to-drain. The drain-to-drain connection is the output 37 of the inverter 31. The gate-to-gate connection is the input 36 of the inverter 31.

In one embodiment, power (Vdd) is supplied to the inverter using a probe, pin, or lead to contact a pad 38 and ground (Vss) may be connected by contacting a probe, pin, or lead to the pad 39. An alternating high/low power may be applied to the input pad 40 to cause the outputs 37 of each inverter in the inverter chain to change state from a 1 (high voltage) to a 0 (low voltage), or from a 0 to a 1. Using an e-beam having a voltage contrast setting, the 0 may have a light shade in an image, and the 1 may have a dark shade in the image.

In one embodiment, power is supplied by a capacitor C connected to an input terminal 36 of a first inverter 31 in the inverter chain. In another embodiment, a laser is applied to the pad 40 to excite electrons in the input line 36 and drive the inverter chain. In another embodiment, a capacitor C may be positioned between the pad 38 and the power line 32, power may be applied to the capacitor (such as by a laser), and the capacitor may provide power (Vdd). An operation of the test structure 30 in the form of an inverter chain is illustrated in FIGS. 3 and 4.

FIG. 3 illustrates an inverter chain without a fault. When a high voltage (1) is applied to the pad 40, the first inverter outputs a low voltage (0). The next inverter in the chain outputs a high voltage (1), and each subsequent inverter outputs an alternating voltage level (e.g. 1, 0, 1, 0, 1, 0). When the voltage applied to the pad 40 is switched to a low voltage (0), the first inverter 31 outputs a high voltage (1), and each subsequent inverter outputs an alternating voltage level (e.g. 0, 1, 0, 1, 0, 1).

Figure 4:
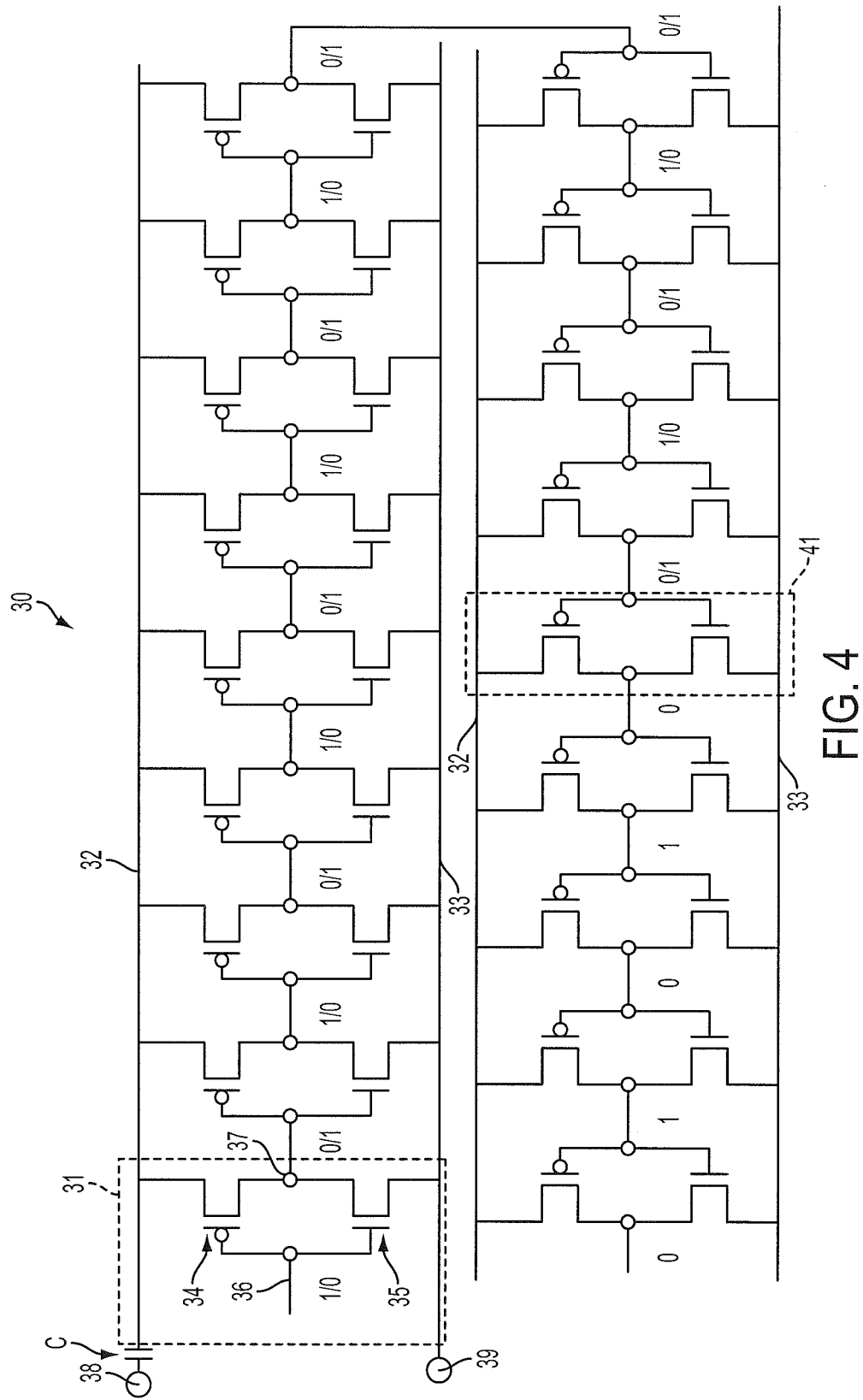
FIG. 4 is a circuit diagram of a test structure demonstrating a faulty electrical unit.

However, as illustrated in FIG. 4, if one of the inverters 41 is faulty, then the output voltage may not change from a 0 to a 1 (or, in an alternative case, from a 1 to a 0). For example, when a low voltage (0) is applied to the pad 40, the first inverter outputs a high voltage (1) and the faulty inverter 41 outputs a low voltage (0). However, when the voltage applied to the pad 40 is switched to a high voltage (1), the first inverter 31 outputs a low voltage (0), but the faulty inverter 41 maintains a low voltage (0). Since the output of the faulty inverter 41 is the same as the output of the preceding inverter, the fault may be readily detected and isolated by detecting two light-colored regions side-by-side in image generated by an e-beam having a voltage contrast setting, and the cause of the fault may be isolated, since the cause is limited to one inverter 41 having two transistors.

Figure 5:
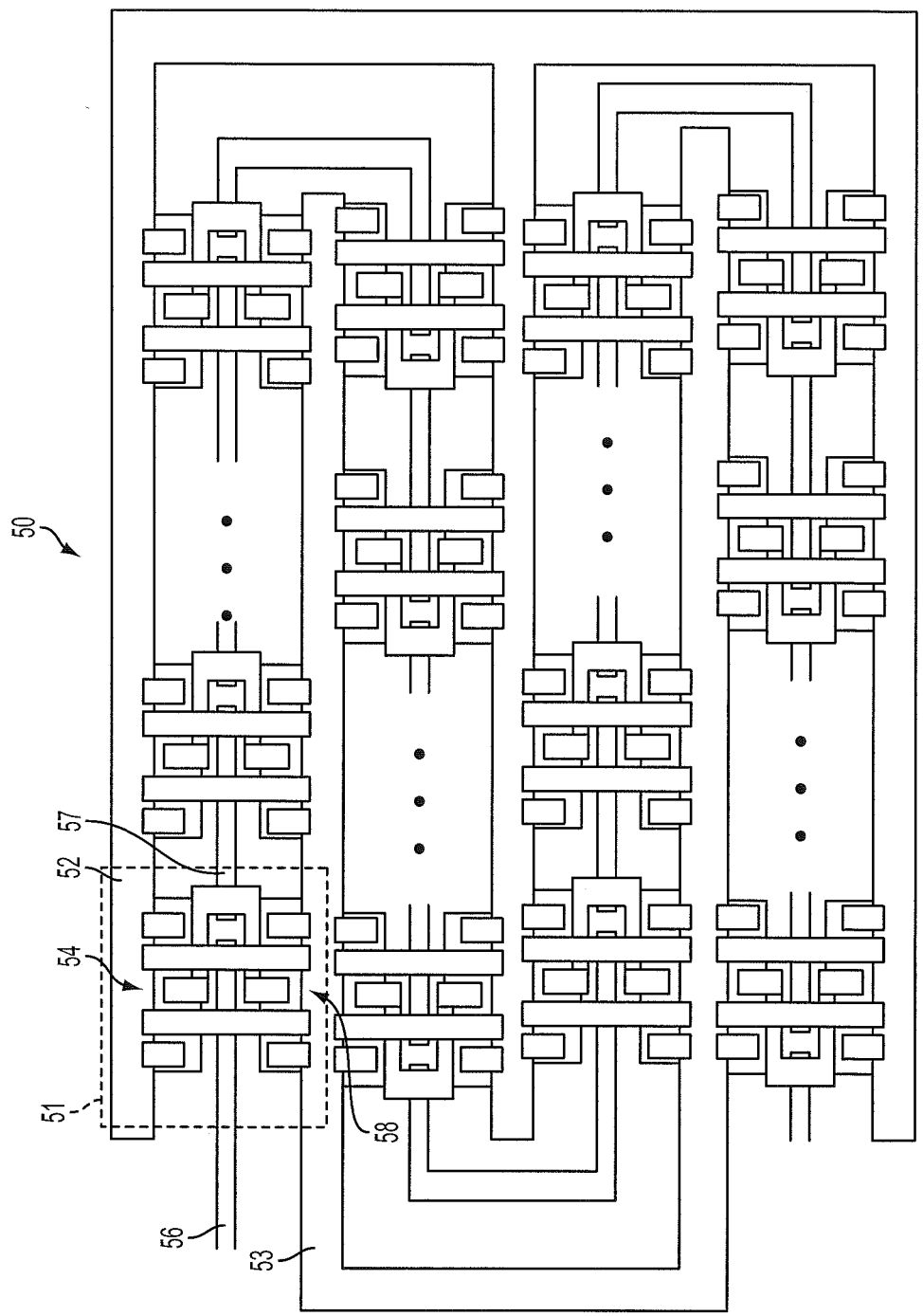
FIG. 5 illustrates a layout of a test structure according to one embodiment of the invention.

FIG. 5 illustrates an example of a physical layout of an inverter string 50 according to one embodiment. The inverter string 50 includes a power (Vdd) line 52 and a ground (Vss) line 53. An inverter 51 comprising PFET transistor 54 and NFET transistor 55 is formed between the power line 52 and the ground line 53. An input line 56 is connected to gates of the PFET transistor 54 and NFET transistor 55, and an output line 57 is connected to a drain-drain connection of the PFET transistor 54 and NFET transistor 55.

As illustrated in FIGS. 3-5, in embodiments of the present invention, the test structure 30 includes an "open chain" of inverters. In the present specification and claims, the term "open" with respect to the test structure 30 or inverter chain means that an input signal of the first inverter 31 in the chain of inverters is driven by an input voltage applied to a pad 40, and may be driven high or low according to the test. In other words, in embodiments of the invention, no closed circuit loop is formed in the chain of inverters. Instead, the inverters are connected output-to-input in a downstream direction only.

Figure 6:
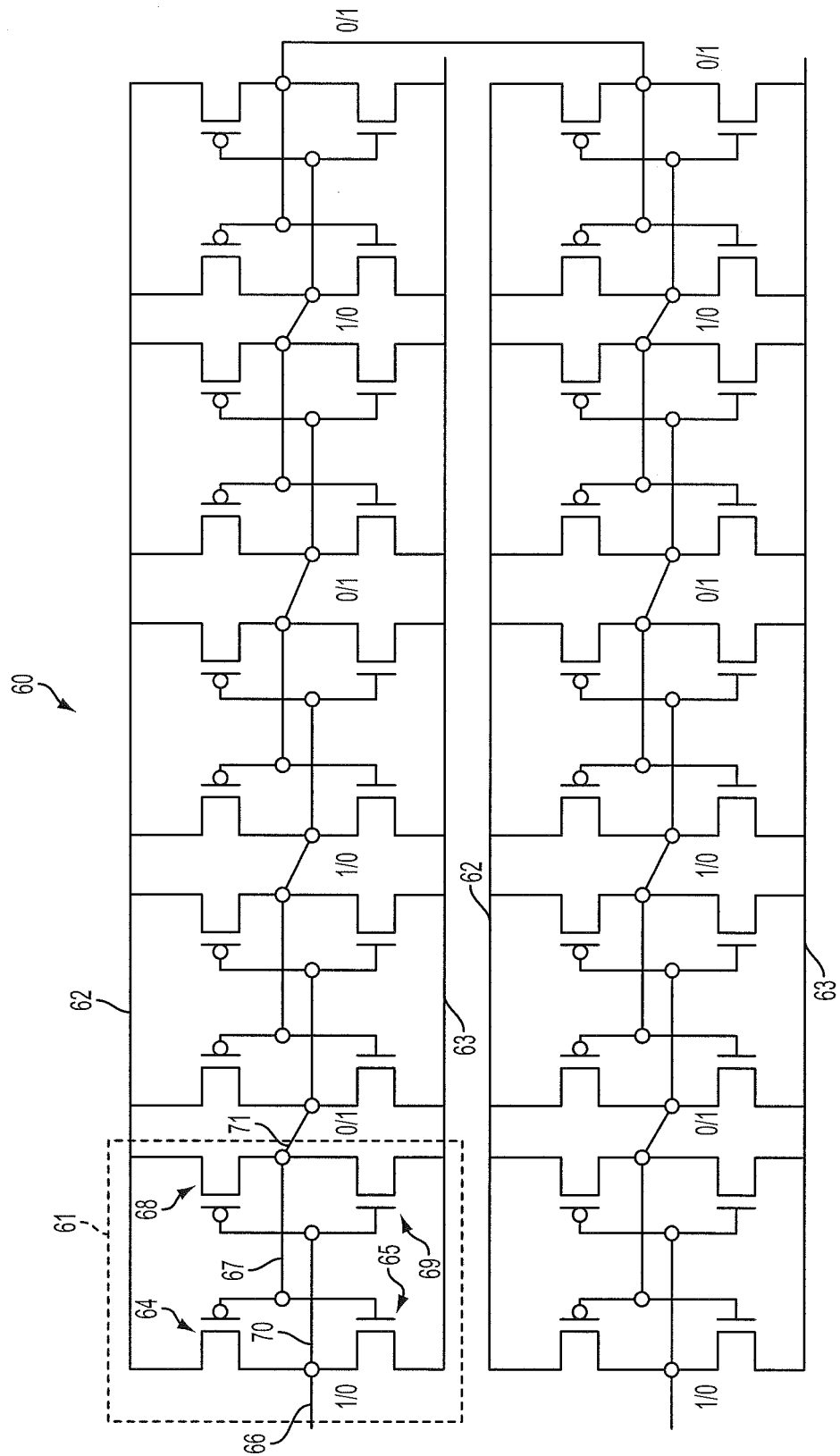
FIG. 6 is a circuit diagram of a test structure according to another embodiment of the invention.

FIG. 6 illustrates a test structure 60 according to another embodiment of the invention. In FIG. 6, the test structure 60 comprises a series of latches 61 connected input-to-output between a power (Vdd) line 62 and a ground (Vss) line 63. Each latch 61 includes an input line 66 and two PFETs 64, 68, and two NFETs 65, 69. The PFET 64 and NFET 65 are connected drain-to-drain between the power line 62 and the ground line 63. The gates of the PFET 64 and NFET 65 are connected to each other, to a drain-to-drain connection of the PFET 68 and NFET 69, and to an output line 71. In addition, the drain-to-drain connection of the PFET 64 and NFET 65 is connected to the gates of the PFET 68 and NFET 69, which are connected to each other and to an input line 66.

In operation, when a high power level (1) is input to the input line 66, a low power level (0) is output from the output line 71. The power level of each subsequent latch 61 alternates between a high power level (1) and a low power level (0). As discussed above with respect to the test structure 30 of FIGS. 3 and 4, by switching the input power level from low to high, or from high to low, while viewing the test structure 60 with an e-beam assembly 4 having a voltage contrast function, a faulty latch may be detected by detecting a latch having a shade that is the same as a previous latch in the latch chain.

In embodiments of the invention, any number of electrical units, such as inverters 31 or latches 61, may be connected input-to-output to form the test structure 30 or 60. The number of electrical units may be selected according to design considerations and predetermined fault tolerances. For example, a lower fault tolerance may correspond to a larger number of electrical units in the test structure 30 or 60. For example, a test structure 30 or 60 comprising only 2-50 electrical units may be provided to test a semiconductor wafer having a very high fault tolerance, while a test structure 30 or 60 comprising 100,000 or more electrical units may be provided to test a semiconductor wafer having a lower fault tolerance. In addition, a number of electrical units in the test structure may correspond to a viewing angle of an image generated by the e-beam assembly 4. For example, if only 1,000 electrical units are viewable in an image generated by the e-beam assembly 4, then a test structure may include approximately 1,000 electrical units, such as inverters 31. In various embodiments, at least 1,000, at least 10,000, at least 100,000, at least one million, and at least ten million electrical units form the test structure 30 or 60.

Figure 7:
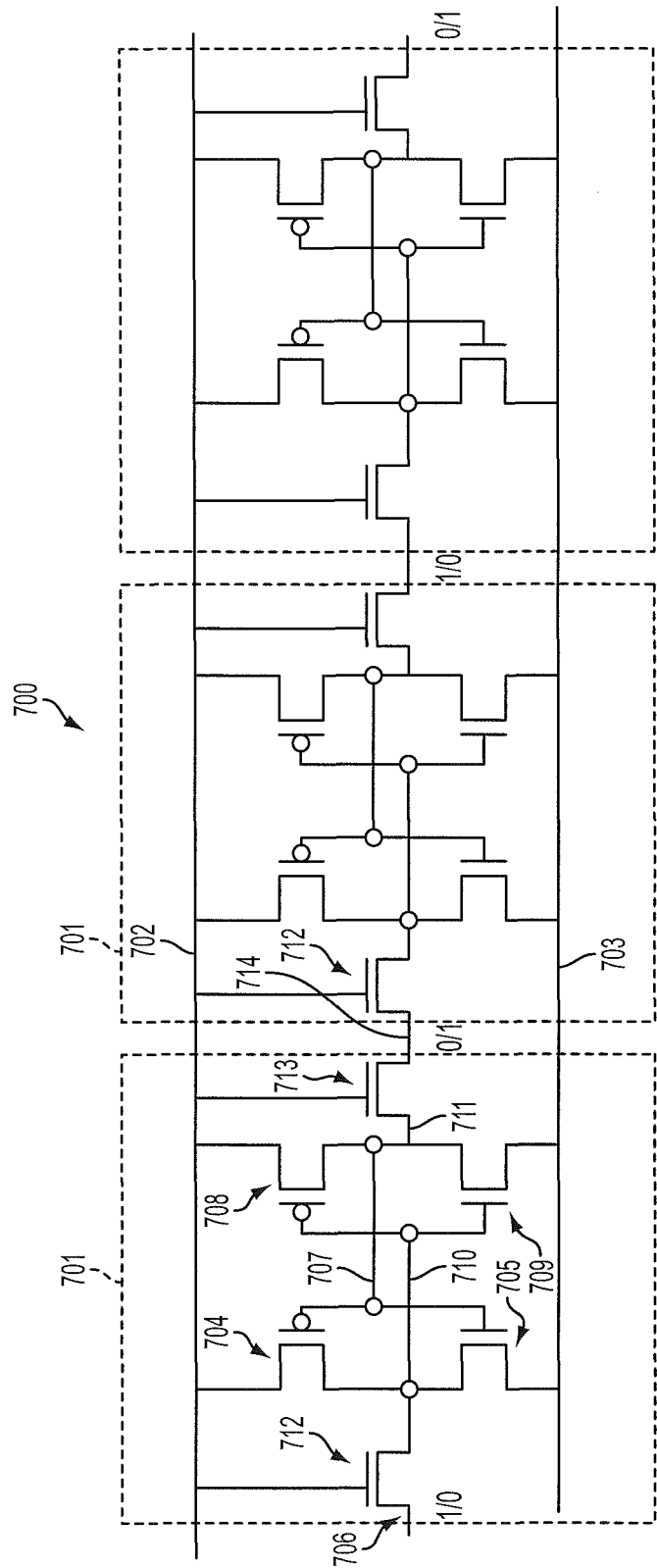
FIG. 7 illustrates a layout of a test structure according to another embodiment of the invention.

FIG. 7 a test structure 700 according to another embodiment of the invention. In particular, FIG. 7 illustrates a test structure 700 formed as an SRAM latch chain with a pass-gate configuration. In FIG. 7, the test structure 700 comprises a series of latches 701 connected input-to-output between a power (Vdd) line 702 and a ground (Vss) line 703. Each latch 701 includes an input line 706 and two PFETs 704, 708, and two NFETs 705, 709. The PFET 704 and NFET 705 are connected drain-to-drain between the power line 702 and the ground line 703. The gates of the PFET 704 and NFET 705 are connected to each other, to a drain-to-drain connection of the PFET 708 and NFET 709, and to an output line 711. In addition, the drain-to-drain connection of the PFET 704 and NFET 705 is connected to the gates of the PFET 708 and NFET 709, which are connected to each other and to an input line 706.

An output NFET 713 is connected by its source to the output line 711, and an input NFET 712 of a subsequent latch 701 is connected source-to-drain to the output NFET 713. The gates of the output and input NFETs 713 and 712 are connected to the power (Vdd) line 702. In the embodiment of FIG. 7, the test structure 700 is configured to correspond to an SRAM latch chain, and the gates of the output NFET 713 and input NFET 712 are configured to correspond to word lines of the SRAM latch chain. Since the test structure 700 includes a structure similar to an SRAM structure, the testing of the test structure 700 may closely correlate with an actual SRAM circuit.

In operation, when a high power level (1) is input to the input line 706, a low power level (0) is output from the output line 711 and passed through the output NFET 713 and the input NFET 712 of the next latch 701. The power level of each subsequent latch 701 alternates between a high power level (1) and a low power level (0). As discussed above with respect to the test structure 30 of FIGS. 3 and 4, by switching the input power level from low to high, or from high to low, while viewing the test structure 700 with an e-beam assembly 4 having a voltage contrast function, a faulty latch may be detected by detecting a latch having a shade that is the same as a previous latch in the latch chain.

Figure 8A:
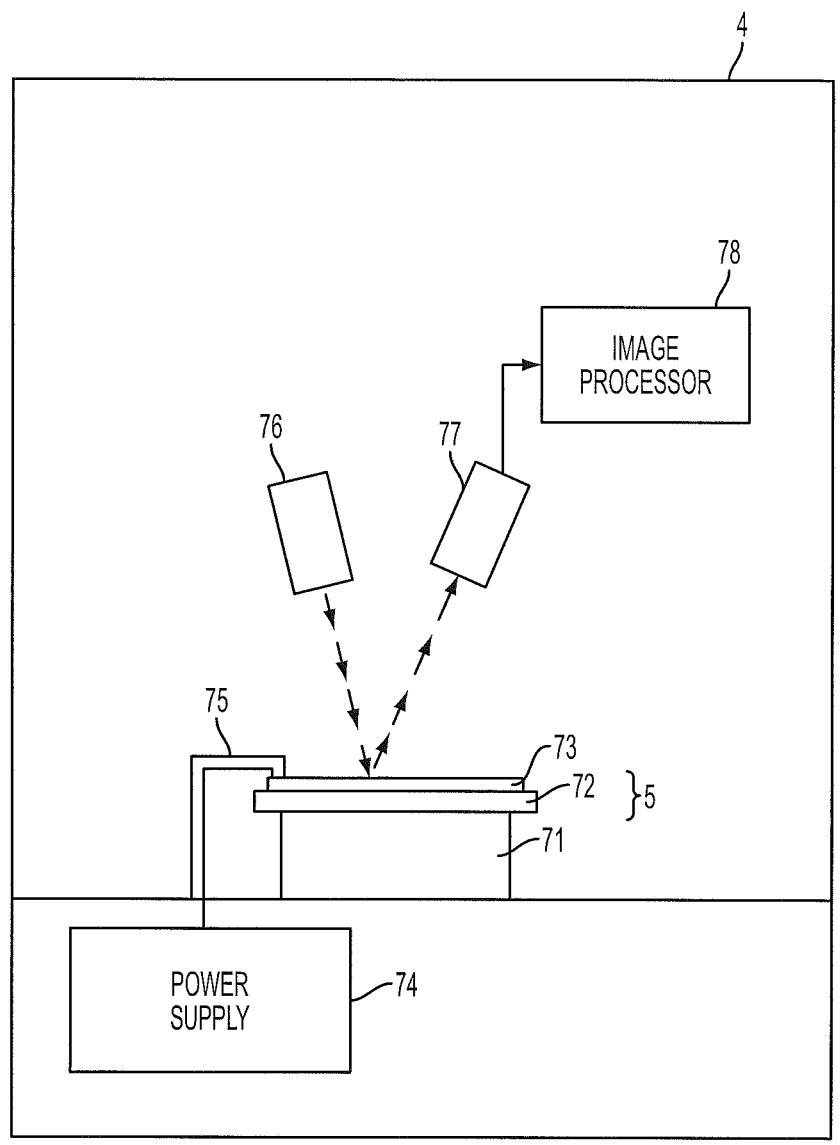
FIGS. 8A and 8B are block diagrams of e-beam assemblies according to embodiments of the invention.
Figure 8B:
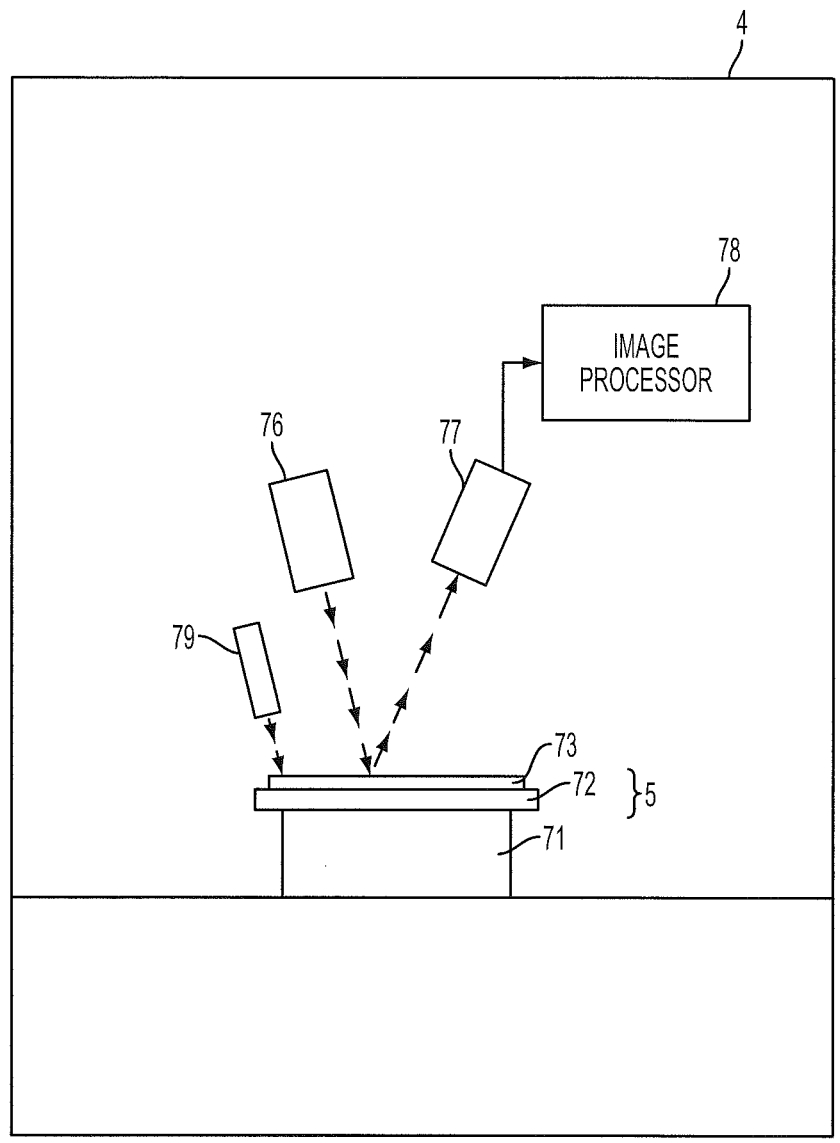

FIGS. 8A and 8B illustrate block diagrams of e-beam assemblies according to embodiments of the invention. Referring to FIG. 8A, the e-beam assembly 4 includes a support 71 to support a wafer 5 with a test structure. A power supply 74 provides power to the metal layer 73 via a probe 75, which may also be referred to as a lead, pin, contact, or other means to physically apply a conductor to a pad of the metal layer 73 to supply power to the metal layer 73. Referring to FIG. 3, for example, the probe 75 may include leads to contact the pads 38, 39, and 40 to supply high power Vdd to the pad 38, ground to the pad 39, and an alternating high and low voltage to the pad 40. In one embodiment, the high voltage is between 0.8V and 1.0V, and the low voltage is between −0.1V and 0.1V.

An e-beam generating device 76 generates an e-beam, represented by arrows in FIG. 8A, and a sensor 77 detects radiation, such as electrons, resulting from the e-beam directed towards the structure. An image processor 78 receives data from the sensor 77 to generate an image corresponding to the structure 73. For example, in embodiments of the present invention, the image processor generates an image having different shades corresponding to different voltages in the structure.

FIG. 7B illustrates an e-beam assembly 4 according to another embodiment of the invention. Unlike the embodiment illustrated in FIG. 7A, a laser beam generator 79 generates a laser beam to charge a capacitor in the structure, providing power to the structure. For example, one laser 79 may provide power to a power (Vdd) line of the structure, and another laser 79 may alternatingly provide power and abstain from providing power to the input of a test structure. Accordingly, in one embodiment, the structure may be tested in a contact-less manner.

Figure 9:
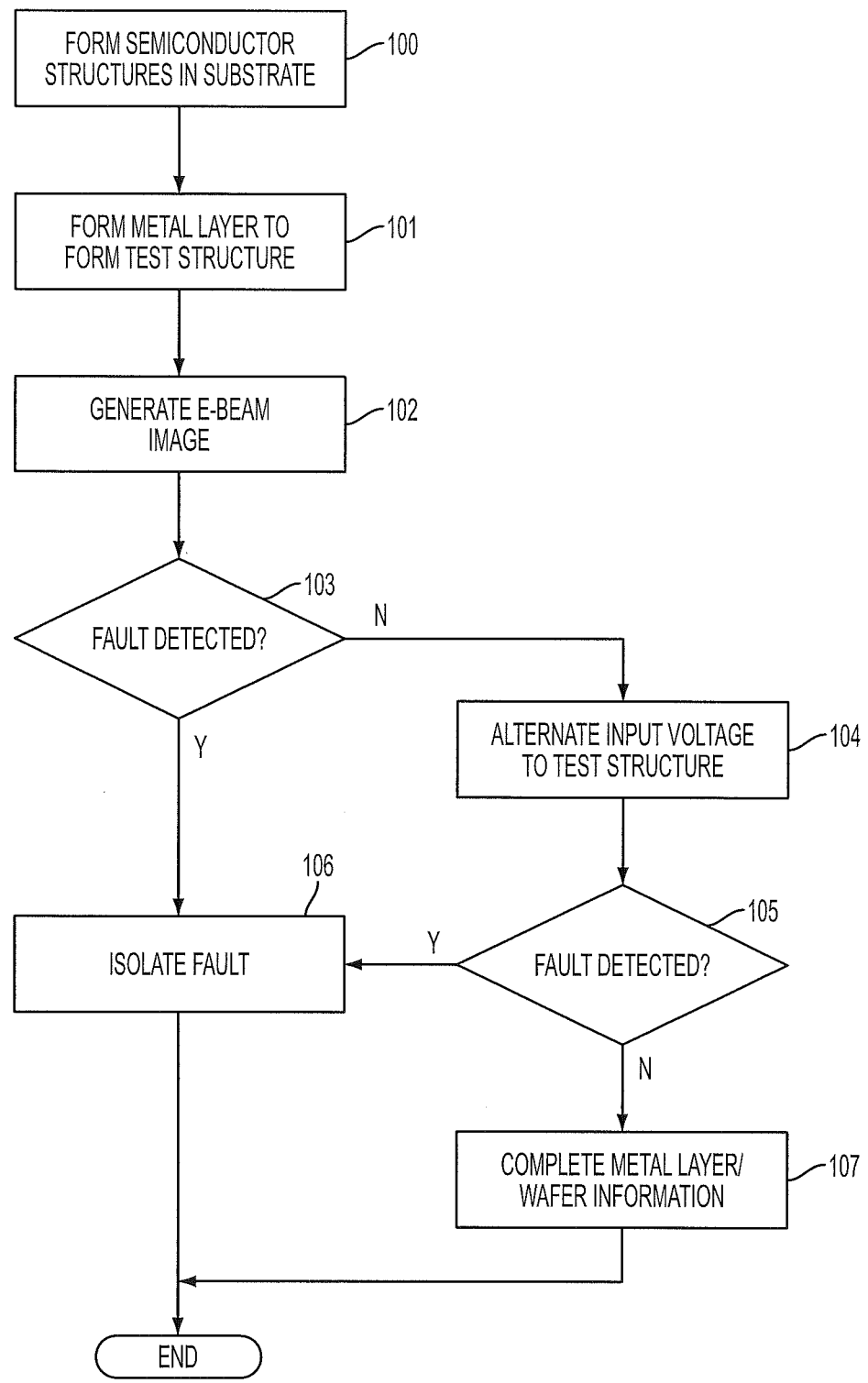
FIG. 9 is a flowchart of a method according to an embodiment of the invention.

FIG. 9 is a flowchart illustrating a method according to embodiments of the present invention. In operation 100, semiconductor structures are formed in a substrate. The semiconductor structures may include, for example, p-type and n-type doped regions in a semiconductor substrate.

In operation 101, a metal layer is formed on the substrate to form a test structure. In one embodiment, the metal layer is only one metal layer. In another embodiment, multiple metal layers may be formed. The test structure may include a plurality of electrical units connected output-to-input. The plurality of electrical units may form an open loop, or in other words, the plurality of electrical units may be connected output-to-input to transmit current only in a downstream direction only from a first input in a chain of electrical units to a last output in the chain of electrical units. In one embodiment, no downstream output is connected to any upstream input in the chain of electrical units. The metal layer may form a test structure including a plurality of inverters or a plurality of latches, for example. In one embodiment, the plurality of latches forms an SRAM latch chain with a pass-gate configuration.

In operation 102, an e-beam is directed at the test structure to generate an e-beam image having a voltage contrast. In one embodiment, the e-beam image may show detected portions of the test structure having a higher voltage as being darker and portions of the test structure having a lower voltage as lighter. Alternatively, the e-beam image may show detected portions of the test structure having a higher voltage as being lighter and portions of the test structure having a lower voltage as darker.

In operation 103, the e-beam image may be analyzed and a fault may be detected. In one embodiment, analyzing the e-beam image is performed by a user. In another embodiment, analyzing the e-beam image is performed by an image analysis computer, processor, or other device. In one embodiment, the e-beam image is stored as digital data and the digital data corresponding to the e-beam image is analyzed by a digital data analysis unit, such as a processor running a computer program, a computer, or other device, to detect the fault.

In embodiments of the present disclosure, detecting a fault includes analyzing the shades of the outputs of the electronic units of the test structure and determining that a fault exists when two consecutive test structures have a same shade. In other words, if two consecutive test structures have outputs that are either both light or both dark, it may be determined that a fault has been detected. In one embodiment, detecting the fault is performed by a computer that analyzes digital data corresponding to the e-beam image to detect consecutive test structures in the digital data having a same shade, as represented by the digital data.

If it is determined in operation 103 that no fault is detected, an input voltage to a first input in the chain of electrical units is alternated between a high voltage and a low voltage and it is determined again in operation 105 whether a fault is detected.

Upon determining in either operation 103 or operation 105 that a fault has been detected in the test structure, the fault may be isolated in operation 106. For example, a specific electrical unit corresponding to the fault may be identified, and the cause of the fault may be determined by analyzing the e-beam image data, by performing further digital scans or analysis of the wafer or the test structure, or by physically testing and analyzing the wafer or the test structure.

Upon determining in operation 105 that no fault is detected, additional metal layers may be formed in operation 107 and the wafer may be completed. For example, wiring, insulation, and other structures may be formed on the metal layer including the test structure.

Although FIG. 9 illustrates a process of alternating an input voltage of a test structure when no fault is detected, embodiments of the present invention encompass a process in which the input voltage is alternated even when a fault is detected. For example, if one fault is detected in the test structure when a high input voltage is applied, another separate fault may be detected in the test structure when a low input voltage is applied.

According to the above embodiments, detection and isolation of faults in FETs of a test structure may be performed without contacting the metal layer with a probe. For example, a single FET may be isolated as being faulty by analyzing an e-beam image of the test structure rather than by applying a probe to components in the test structure.

According to embodiments of the invention, the test structure may be formed by forming a chain of electrical units in the test structure, each unit receiving an input voltage and outputting an opposite voltage to an input of the next electrical unit in the chain. In some embodiments, the units include inverters or latches, the inverters or latches comprising FET transistors.

In the above-described embodiments, the units of the test structure output alternating voltages. However, it is understood that the test structure may be designed to have units that output a same voltage and the input voltage, and a fault may then be identified by isolating a unit that outputs a different voltage from the input voltage. Other modifications and equivalent structures are encompassed by embodiments of the present invention.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

What is claimed is:

1. A test structure of a semiconductor wafer, the test structure comprising:
   a series of electrical units connected electrically in series output-to-input in an open loop configuration, the series of electrical units configured to have alternating output voltages, such that each electrical unit is configured to output a voltage opposite an output voltage of a preceding electrical unit, and such that each electrical unit is configured to have an output voltage that alternates when an input voltage applied to a first electrical unit in the series of electrical units alternates,
   wherein the series of electrical units is a series of latches, and
   wherein each latch of the series of latches comprises two pairs of cross-coupled FETs, wherein a gate of a first pair of the FETs is connected to a drain-to-drain connection of the second pair of the FETs, and a gate of the second pair of the FETs is connected to a drain-to-drain connection of the first pair of the FETs.

2. The test structure of claim 1, wherein the series of electrical units is a series of inverters, each inverter comprising a pair of field effect transistors (FETs) connected drain-to-drain.

3. The test structure of claim 1, wherein the test structure is formed by a metal layer on the semiconductor wafer having no intervening metal layers between the metal layer and a substrate of the semiconductor wafer.

4. The test structure of claim 1, wherein each latch further includes an input latch configured to receive an input voltage at a source and having a drain connected to the drain-to-drain connection of the first pair of FETs, and having a gate connected to a power line, and each latch further includes an output FET having source connected to the drain-to-drain connection of the second pair of FETs, a drain connected to a source of an input FET of a next latch in the series of latches, and a gate connected to the power line.

5. The test structure of claim 4, wherein the FETs include positive field effect transistors (PFETs) and negative field effect transistors (NFETs), and the structure has an equal number of PFETs and NFETs.

6. The structure of claim 1, wherein a number of the electrical units is at least 100.

7. The test structure of claim 1, wherein a first electrical unit in the series of electrical units is connected to at least one of a pad configured to receive a probe to provide an input voltage to the series of electrical units and a capacitor configured to generate the input voltage upon being irradiated by one of an optical beam and an electron beam.

8. A method, comprising:
   applying a voltage to a test structure comprising a plurality of electrical units connected in series output-to-input, each of the plurality of electrical units configured to output a voltage at a level opposite a voltage level of a preceding electrical unit of the plurality of electrical units connected in series; and
   determining whether a fault exists in the test structure by generating an e-beam image of the test structure and analyzing output voltages of the plurality of electrical units in the e-beam image to determine whether output voltages of two consecutive electrical units are the same,
   wherein determining whether the fault exists in the test structure includes analyzing the output voltages of the plurality of electrical units in the e-beam image a first time when a high voltage is applied to an input of the test structure and a second time when a low voltage is applied to an input of the test structure.

9. The method of claim 8, wherein generating the e-beam image includes generating a voltage-contrast image, and
   determining whether the fault exists in the test structure includes determining whether the two consecutive electrical units have a same shade of lightness or darkness.

10. The method of claim 8, wherein the e-beam image simultaneously displays each of the plurality of electrical units, and
    analyzing the output voltages of the plurality of electrical units in the e-beam image includes simultaneously analyzing each of the plurality of electrical units displayed in the e-beam image.

11. The method of claim 8, wherein applying the voltage to the test structure includes charging a capacitor connected to the test structure to provide the voltage to the metal layer.

12. The method of claim 11, wherein charging the capacitor includes directing a laser beam at the capacitor.

13. The method of claim 8, wherein applying the voltage to the test structure includes applying a voltage probe to an input voltage pad connected to an input of a first electrical unit of the plurality of electrical units connected in the series, the first electrical unit being an electrical unit at an end-most position of the plurality of electrical units connected in the series.

14. The method of claim 8, wherein the test structure is formed by a first metal layer located on a semiconductor substrate, such that no metal layer is located between the first metal layer and the semiconductor substrate.

15. The method of claim 8, wherein the first metal layer includes portions of at least one static random access memory (SRAM) circuit, and
    the method further comprises:
    forming at least one additional metal layer to complete the at least one SRAM circuit upon determining that no fault exists in the test structure.

16. A system, comprising:
    a test structure of a semiconductor chip, the test structure including a series of electrical units connected outputto-input, the series of electrical units configured to have alternating output voltages, such that each electrical unit is configured to output a voltage opposite an output voltage of a preceding electrical unit and such that each electrical unit is configured to have an output voltage that alternates when an input voltage applied to a first electrical unit in the series of electrical units alternates;

an e-beam assembly configured to direct an e-beam at a test structure to detect voltage levels at outputs of the electrical units; and an analysis unit configured to detect whether a faulty electrical unit exists in the test structure by analyzing an image generated by the e-beam assembly, wherein the e-beam assembly is configured to apply an input voltage to a first electrical unit in the series of electrical units by applying radiation to a capacitor connected to a voltage input of the first electrical unit.

17. The system of claim 16, wherein the analysis unit is configured to detect a faulty electrical unit by detecting whether outputs of two consecutive electrical units have a same shade in the e-beam image.

18. The system of claim 16, wherein the e-beam assembly is configured to apply an input voltage to a first electrical unit in the series of electrical units by applying a voltage probe to a pad connected to an input of the first electrical unit, wherein the first electrical unit is an electrical unit at an upstream-most end of the series of electrical units.

19. The system of claim 16, wherein the e-beam assembly is configured to generate first and second e-beams, the e-beam assembly is configured to direct the first e-beam at the electrical units at the test structure to detect the voltage levels at the outputs of the electrical units, and the e-beam assembly is configured to direct the second e-beam at the capacitor connected to the voltage input of the first electrical unit to generate the input voltage.

20. The system of claim 16, wherein the radiation is a laser beam.

21. The system of claim 16, wherein the analysis unit simultaneously analyzes each electrical unit in the series of electrical units in the image generated by the e-beam assembly.

* * * * *